(12) United States Patent
Molas et al.

(10) Patent No.: US 9,722,177 B2
(45) Date of Patent: Aug. 1, 2017

(54) RESISTIVE RANDOM ACCESS MEMORY DEVICE WITH A SOLID ELECTROLYTE INCLUDING A REGION MADE OF A FIRST METAL OXIDE AND DOPED BY A SECOND ELEMENT DISTINCT FROM THE FIRST METAL

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Philippe Blaise, Grenoble (FR); Faiz Dahmani, La Varenne Saint-Hilaire (FR); Elisa Vianello, Grenoble (FR)

(73) Assignee: COMMISSARIAT À L'ÉNERGIE ATOMIQUE ET AUX ÉNERGIES ALTERNATIVES, Paris (FR)

(\*) Notice: Subject to any disclaimer, the term of this patent is extended or adjusted under 35 U.S.C. 154(b) by 0 days.

(21) Appl. No.: 14/736,858

(22) Filed: Jun. 11, 2015

(65) Prior Publication Data

US 2015/0364679 A1    Dec. 17, 2015

(30) Foreign Application Priority Data

Jun. 11, 2014  (FR) ...................................... 14 55286

(51) Int. Cl.
*H01L 45/00* (2006.01)
*G11C 13/00* (2006.01)

(52) U.S. Cl.
CPC .......... *H01L 45/08* (2013.01); *G11C 13/0011* (2013.01); *H01L 45/085* (2013.01); *H01L 45/1233* (2013.01); *H01L 45/1253* (2013.01); *H01L 45/1266* (2013.01); *H01L 45/146* (2013.01)

(58) Field of Classification Search
CPC ............. H01L 27/2436; H01L 27/2463; H01L 45/1253; H01L 45/145; H01L 45/147; H01L 45/1641
See application file for complete search history.

(56) References Cited

U.S. PATENT DOCUMENTS

| 8,941,089 B2* | 1/2015 | Gopalan ............... H01L 45/085 257/3 |
| 2007/0120124 A1* | 5/2007 | Chen ................... H01L 29/0895 257/43 |
| 2008/0061341 A1 | 3/2008 | Lung |
| 2011/0140065 A1* | 6/2011 | Maesaka ............. H01L 27/2436 257/2 |

(Continued)

FOREIGN PATENT DOCUMENTS

FR    3 003 401 A1    9/2014

OTHER PUBLICATIONS

Preliminary Search Report as issued in French Patent Application No. 1455286, dated Feb. 12, 2015.

(Continued)

*Primary Examiner* — Davienne Monbleau
*Assistant Examiner* — Leslie Pilar Cruz
(74) *Attorney, Agent, or Firm* — Pillsbury Winthrop Shaw Pittman LLP

(57) ABSTRACT

A resistive random access memory device includes a first electrode made of inert material; a second electrode made of soluble material; a solid electrolyte including a region made of an oxide of a first metal element, referred to as first metal oxide doped by a second element, distinct from the first metal and able to form a second oxide, the second element being selected such that the band gap energy of the second oxide is strictly greater than the band gap energy of the first metal oxide, the atomic percentage of the second element within the region of the solid electrolyte being comprised between 5% and 20%.

10 Claims, 2 Drawing Sheets

(56) References Cited

U.S. PATENT DOCUMENTS

| | | | |
|---|---|---|---|
| 2013/0001497 A1 | 1/2013 | Ohba | |
| 2013/0082228 A1* | 4/2013 | Parrillo | H01L 45/08 257/4 |
| 2013/0082232 A1* | 4/2013 | Wu | H01L 45/08 257/5 |
| 2014/0103284 A1* | 4/2014 | Hsueh | H01L 45/1608 257/4 |

OTHER PUBLICATIONS

Y.S. Chen et al., "Well controlled multiple resistive switching states in the Al local doped $HfO_2$ resistive random access memory device," Journal of Applied Physics, vol. 113, No. 16, Apr. 2013, pp. 164507-1-164507-6.

L.F. Liu et al., "Unipolar resistive switching and mechanism in Gd-doped-$TiO_2$ -based resistive switching memory devices," Semiconductor Science and Technology, vol. 26, No. 11, Oct. 2011, 6 pages.

L. Zhao et al., "Dopant Selection Rules for Extrinsic Tunability of $HfO_x$RRAM Characteristics: A Systematic Study," 2013 Symposium on VLSI Technology Digest of Technical Papers, Jun. 2013, 2 pages.

Y.Y. Chen et al., "Tailoring switching and endurance / retention reliability characteristics of $HfO_2$ / Hf RRAM with Ti, Al, Si dopants," 2014 Symposium on VLSI Technology Digest of Technical Papers, Jun. 2014, 2 pages.

Final Office Action as issued in U.S. Appl. No. 14/737,593, dated May 16, 2017.

* cited by examiner

"OFF" state     "ON" state

RESISTIVE RANDOM ACCESS MEMORY DEVICE WITH A SOLID ELECTROLYTE INCLUDING A REGION MADE OF A FIRST METAL OXIDE AND DOPED BY A SECOND ELEMENT DISTINCT FROM THE FIRST METAL

CROSS-REFERENCE TO RELATED APPLICATIONS

This application claims priority to French Patent Application No. 1455286, filed Jun. 11, 2014, the entire content of which is incorporated herein by reference in its entirety.

FIELD

The present invention relates to the field of rewritable non-volatile memories, and more specifically to that of resistive random access memories. A resistive random access memory comprises first and second electrodes separated by a layer made of electrically insulating material, and passes from an insulating state to a conducting state by formation of a conductive filament between the first and second electrodes.

BACKGROUND

Resistive Random Access Memories (RRAM) are today the subject of great interest, particularly on account of their low electrical consumption and their high operating speed.

A resistive type memory cell has at least two states: a "High Resistance State" (HRS), also called "OFF" state, and a "Low Resistance State" (LRS) or "ON" state. It may thus be used to store binary information.

Three types of resistive memories may be distinguished: memories based on thermochemical mechanism, memories based on valence change, and memories based on electrochemical metallisation.

The field of the present invention more particularly relates to this latter category based on ion conduction materials (CBRAM or "Conductive Bridging RAM" memories). The operation resides in the reversible formation and rupture of a conductive filament in a solid electrolyte, through dissolution of a soluble electrode. These memories are promising due to their low programming voltages (of the order of a Volt), their short programming times (<1 µs), their low consumption and their low integration cost. Furthermore, these memories can be integrated into the metallisation levels of the logic of a circuit ("above IC"), which makes it possible to increase the integration density of the circuit. From the architectural viewpoint, they only require a selection device, a transistor or a diode for example.

The operation of CBRAM memories is based on the formation, within a solid electrolyte, of one or more metal filaments (also called "dendrites") between two electrodes, when the electrodes are taken to suitable potentials. The formation of the filament makes it possible to obtain a given electrical conduction between the two electrodes. By modifying the potentials applied to the electrodes, it is possible to modify the distribution of the filament, and thus to modify the electrical conduction between the two electrodes. For example, by reversing the potential between the electrodes, it is possible to make disappear or reduce the metal filament, so as to eliminate or reduce considerably the electrical conduction due to the presence of the filament.

FIGS. 1A and 1B are schematic diagrams of a CBRAM type memory device 1, respectively in the "OFF" state, and in the "ON" state.

This device 1 is formed by a Metal/Ion conductor/Metal type stack. It comprises a solid electrolyte 2, for example based on doped chalcogenide (e.g. GeS) or oxide (e.g. $Al_2O_3$). The electrolyte 2 is arranged between a lower electrode 3, for example made of Pt, forming an inert cathode, and an upper electrode 4 comprising a portion of ionisable metal, for example copper, and forming an anode. A portion of ionisable metal is a portion of metal able to form metal ions (here $Cu^{2+}$ ions) when it is subjected to a suitable electrical potential. The device 1 represented in FIG. 1A or 1B typically forms a memory point, that is to say a unit memory cell, of a memory comprising a multitude of these memory devices.

As indicated previously, the memory state of a CBRAM memory device results from the difference in electrical resistivity between two states: "ON" and "OFF".

In the "OFF" state (FIG. 1A), the metal ions (here $Cu^{2+}$ ions for a soluble electrode comprising Cu) coming from the portion of ionisable metal are dispersed throughout the solid electrolyte 2. Thus, no electrical contact is established between the cathode 3 and the anode 4, that is to say between the upper electrode and the lower electrode. The solid electrolyte comprises an electrically insulating zone of high resistivity between the anode and the cathode.

When a positive potential V is applied to the upper soluble electrode 4 (the anode), an oxidation-reduction reaction takes place at the electrode, creating mobile ions 5 (FIG. 1A). In the case of a copper electrode 4, the following reaction takes place:

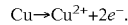

The ions 5 then move in the electrolyte 2 under the effect of the electrical field applied to the electrodes. The speed of movement depends on the mobility of the ion in the electrolyte in question, which guides the choice of the soluble electrode/electrolyte pairing (examples: Ag/GeS; $Cu/Al_2O_3$, etc.). The speeds of movement of the ions are of the order of nm/ns.

On arrival at the inert electrode 3 (the cathode), the ions 5 are reduced due to the presence of electrons supplied by the electrode 3, leading to the growth of a metal filament 6 according to the following reaction:

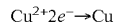

The filament 6 grows preferentially in the direction of the soluble electrode 4.

The memory 1 then passes to the "ON" state (FIG. 1B) when the filament 6 enables contact between the electrodes 3 and 4, making the stack conductive. This phase is called "SET" of the memory.

To pass to the "OFF" state ("RESET" phase of the memory), a negative voltage V is applied to the upper electrode 4, leading to the dissolution of the conductive filament. To justify this dissolution, thermal (heating) and oxidation-reduction mechanisms are generally put forward. More precisely, the step consisting in writing for the first time the memory 1, that is to say forming for the first time the filament in the electrolyte 2 of the memory 1, is called "forming". "SET" is thus taken to mean the step of formation of the filament 6 carried out after at least one first erasing of the memory cell, that is to say after the filament of the memory cell has at least been formed a first time (forming step) then dissolved (RESET step).

Often, the electrolyte 2 contains in the "OFF" state a residual filament 6 in contact with the cathode 3. This stems from the preceding SET phase and has not been dissolved completely during the RESET of the memory. The filament is designated residual when it does not establish a sufficient electrical conduction between the electrodes to obtain the "ON" state.

An area of development for CBRAM memories relates to the widening of the memory window; the latter is defined as the ratio between the resistances of the insulating "OFF" and "ON" states, that is to say the ratio Roff/Ron. The higher this ratio, the easier it is to distinguish the two logic states "OFF" and "ON" of the CBRAM memory. A wide window even makes it possible to envisage multi-bit coding, that is to say to obtain more than two states with a single memory cell using several levels (i.e. at least 3) of resistance.

SUMMARY

An aspect of the invention aims to provide a solution to the aforementioned problems by proposing a metal oxide based CBRAM memory cell with improved electrical performances, and in particular with a large memory window.

A first aspect of the invention thus relates to a resistive random access memory device comprising:
a first electrode made of inert material;
a second electrode made of soluble material;
a solid electrolyte, the first and second electrodes being respectively in contact with one of the faces of the electrolyte on either side of the electrolyte, the second electrode being able to supply mobile ions circulating in the solid electrolyte to the first electrode to form a conductive filament between the first and second electrodes when a voltage is applied between the first and second electrodes;
the solid electrolyte comprising a region made of an oxide of a first metal element, designated "first metal oxide" and the region being doped by a second element, distinct from the first metal and able to form a second oxide, the second element being selected such that the band gap energy of the second oxide is strictly greater than the band gap energy of the first metal oxide, the atomic percentage of the second element within the region of the solid electrolyte being comprised between 5% and 20%.

"Band gap energy", or "gap", of a material is taken to mean the width of the band gap of the material, that is to say the energy difference between the minimum of the conduction band and the maximum of the valence band.

An embodiment of the invention makes it possible to contribute to the widening of the memory window by using a doping of the electrolyte made of metal oxide MOx (for example a gadolinium oxide GdOx, with a composition that could be $Gd_2O_3$) by a second element (beneficially metal) D (for example aluminium Al) selected such that the band gap energy of the oxide DOx is strictly greater than the band gap energy of the oxide MOx. To achieve this result, the atomic percentage of the second element D within the doped region of the solid electrolyte is comprised between 5% and 20%.

Thanks to the invention, it will be appreciated that this widening of the memory window does not take place moreover to the detriment of other electrical performances of the memory such as the forming voltage or the retention.

Thus, one of the difficulties of metal oxide based CBRAM memories relates to the difficulty of forming the filament in the electrolyte during the first use of the memory, that is to say during the forming step. This step consists in applying a voltage to the terminals of the memory, designated "forming voltage", required for the formation of the filament in the electrolyte during the first use of the CBRAM memory cell. The doping by the second metal D such as aluminium can have two opposite effects; the doping makes it possible on the one hand to contribute to the creation of a plurality of oxygen vacancies in the electrolyte, and particularly in the region of the electrolyte made of first metal oxide doped by the second metal D. This plurality of oxygen vacancies makes it possible to facilitate the movement of mobile ions, and thus the formation of the conductive filament. This thus contributes to reducing the forming voltage, that is to say the voltage to apply between the soluble electrode and the inert electrode to enable the formation of the conductive filament during the forming step. Conversely, by doping the electrolyte too much, the risk is taken of coming closer to an alloy (for example a $Gd_{2-y}Al_yO_3$ alloy); in this case, by replacing the electrolyte by a ternary alloy, there is a move away from the properties of $Gd_2O_3$ to come closer to those of $Al_2O_3$ and the forming voltage will be increased in so far as $Al_2O_3$ has a forming voltage intrinsically (i.e. all the technological characteristics such as the method of depositing the $Gd_2O_3$ and $Al_2O_3$ being the same moreover) higher than that of $Gd_2O_3$. In order to conserve a reduced forming voltage (or at least to conserve a forming voltage close to that of the material of the non-doped electrolyte, for example $Gd_2O_3$), it is advisable to select the atomic percentage ad hoc for the second metal D within the doped region of the solid electrolyte; a percentage comprised between 5% and 20% makes it possible to efficiently meet these two opposing effects.

Another difficulty of metal oxide based CBRAM memories relates to the retention of information, that is to say the retention in the "OFF" state and in the "ON" state. It is sought to improve the stability of the insulating and conducting states, particularly for high operating temperatures.

It is considered that there is a retention error when the memory cell loses the information, this loss being defined from a predetermined criterion; for example, in the initial state (t=0), that is to say immediately after having applied the writing operation, the resistance $R_{ON}$ of the memory in the "ON" state is minimal. Then, over time, the resistance in the "ON" state increases. The predetermined criterion consists for example in defining a resistance threshold above which it is considered that retention of the information is no longer assured. From this threshold, it is considered that the memory is in a failure state. It could for example be considered that the information in the memory cell is lost when its resistance has increased twofold compared to its initial resistance $R_{ON}$ just after programming (t=0). As evoked above, the doping by the second metal D contributes to the creation of a plurality of oxygen vacancies in the electrolyte; the consequence of the introduction of oxygen vacancies in the electrolyte is to degrade the retention; in fact the oxygen vacancies offer privileged diffusion sites for the atoms (for example Cu) constituting the filament. The dissolution of the filament is thus accelerated. It is thus desirable to introduce sufficiently little dopants so as not to degrade the retention; a percentage comprised between 5% and 20% makes it possible to limit this degradation, or even to maintain a retention substantially identical to that obtained with the material of the non-doped electrolyte.

Apart from the characteristics that have been evoked in the previous paragraph, the device according to an aspect of the invention may have one or more complementary characteristics among the following, considered individually or according to any technically possible combinations thereof:

the second element is selected such that the electrical permittivity of the material of the doped region is less than or equal to the electrical permittivity of the first metal oxide; thus, the permittivity of $Gd_2O_3$:Al ($Gd_2O_3$ doped with Al) is less than the permittivity of non-doped $Gd_2O_3$;

the second element is selected such that the electrical permittivity of the second oxide is strictly less than the electrical permittivity of the first metal oxide; this embodiment covers the case where the second element locally creates a material (for example a material of AlOx type in the case of doping by Al) in the first oxide (for example $Gd_2O_3$), that is to say the case where the material is not totally inter-mixed after doping;

the second element is a metal distinct from the first metal and able to form a second metal oxide;

the second element is selected such that the first metal oxide doped by the second element has a band gap energy substantially equal to the band gap energy of the first metal oxide not doped by the second element; two substantially equal energies are taken to mean two energies equal to +/−200 meV;

the atomic percentage of the second element within the region of the solid electrolyte is substantially equal to 10%;

the first metal oxide is gadolinium oxide and the second element is aluminium;

according to a first variant, the solid electrolyte comprises:
  a first sub-layer in contact with the first electrode made of inert material, and
  a second sub-layer in contact with the second electrode made of soluble material, the region of the solid electrolyte made of first metal oxide doped by the second element being a central sub-layer comprised between the first and second sub-layers;

according to a second variant, the solid electrolyte comprises:
  a first sub-layer in contact with the first electrode made of inert material, and
  a second sub-layer in contact with the second electrode made of soluble material,
  a central sub-layer comprised between the first and second sub-layers;
the region of the solid electrolyte made of first metal oxide doped by the second element being the first sub-layer and/or the second sub-layer;

according to a third variant, the solid electrolyte is entirely formed by the region made of first metal oxide doped by the second element;

the second element is selected such that the length of the bond between the second element and oxygen is less than the length of the bond between the first metal and oxygen.

Embodiments of the invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

Unless stated otherwise, a same element appearing in the different Figures has a single reference.

In the present description, "oxide based CBRAM memory cell" is taken to mean a CBRAM memory cell comprising an electrolyte based on a metal oxide.

As mentioned above, an aspect of the invention beneficially makes it possible to contribute to the widening of the memory window by using a doping of the electrolyte made of metal oxide MOx (for example a gadolinium oxide GdOx such as $Gd_2O_3$) by a second element (in an embodiment a metal, for example aluminium Al) selected such that the band gap energy of the oxide DOx is strictly greater than the band gap energy of the oxide MOx. To achieve this result, the atomic percentage of the second element D within the doped region of the solid electrolyte is comprised between 5% and 20%.

Figure 3:
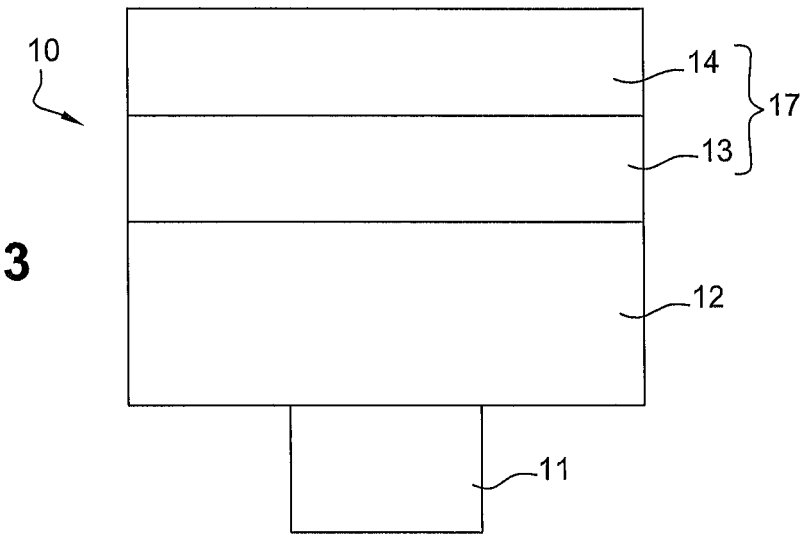
FIG. 3 schematically shows the structure of an oxide based CBRAM memory cell according to an embodiment of the invention, and FIG. 4 schematically shows the structure of an oxide based CBRAM memory cell according to a variant of the embodiment of the invention of FIG. 3.

An example of a CBRAM memory cell 10 according to an embodiment of the invention is illustrated in FIG. 3.

The memory cell 10 comprises:
  a first electrode 11, also called cathode or inert electrode hereafter;
  a solid electrolyte 12. The solid electrolyte 12 comprises a region made of oxide of a first metal, designated "first metal oxide", the region being doped by a second metal, distinct from the first metal and able to form a second metal oxide. The second metal is selected such that the band gap energy of the second metal oxide is strictly greater than the band gap energy of the first metal oxide and the atomic percentage of the second metal within the region of the solid electrolyte 12 is comprised between 5% and 20%;
  a second electrode 17, also called anode or soluble electrode hereafter, and comprising a source of ions layer 13 and a metal line 14.

When a voltage is applied between the inert electrode 11 and the metal line 14 of the soluble electrode 17, the source of ions layer 13 supplies mobile ions which circulate in the solid electrolyte 12 to the inert electrode 11 to form a conductive filament between the inert electrode 11 and the soluble electrode 17.

According to the first embodiment illustrated in FIG. 3, the inert electrode 11 is a pad, for example made from an inert interconnection metal, such as tungsten W, titanium nitride TiN or tantalum nitride TaN.

According to the first embodiment illustrated in FIG. 3, the source of ions layer 13 of the soluble electrode 17 is made from an alloy of copper Cu and of an element of the chalcogen family such as Te. The source of ions layer 13 of the soluble electrode 17 may thus be made from CuTe. More generally, the source of ions layer 13 may be made from copper Cu and alloys thereof, silver Ag and alloys thereof, zinc Zn and alloys thereof, an alloy of copper and/or zinc and/or silver, such as: AgCu, AgZn, CuZn, AgCuZn, and alloys thereof.

According to a particularly beneficial embodiment illustrated in FIG. 3, the solid electrolyte 12 is made of gadolinium oxide $Gd_2O_3$ and the second doping metal is aluminium Al with an atomic percentage selected so that the first metal oxide doped by the second metal (i.e. $Gd_2O_3$:Al) has a band gap energy substantially equal to the band gap energy of the non-doped first metal oxide (i.e. $Gd_2O_3$) at some 200 meV. An atomic percentage of Al substantially equal to 10% beneficially meets this latter constraint and makes it possible to obtain the desired effect on the memory window without degrading the forming voltage and the retention.

Figure 1:
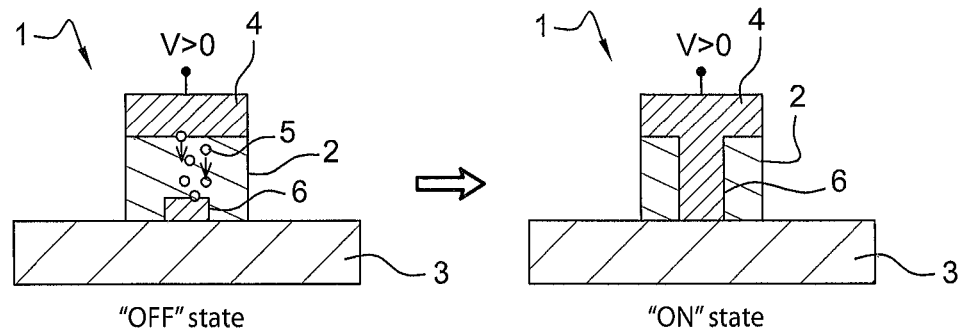
FIG. 1 schematically illustrates the passage from an "OFF" state to an "ON" state for a CBRAM type memory device.
Figure 2:
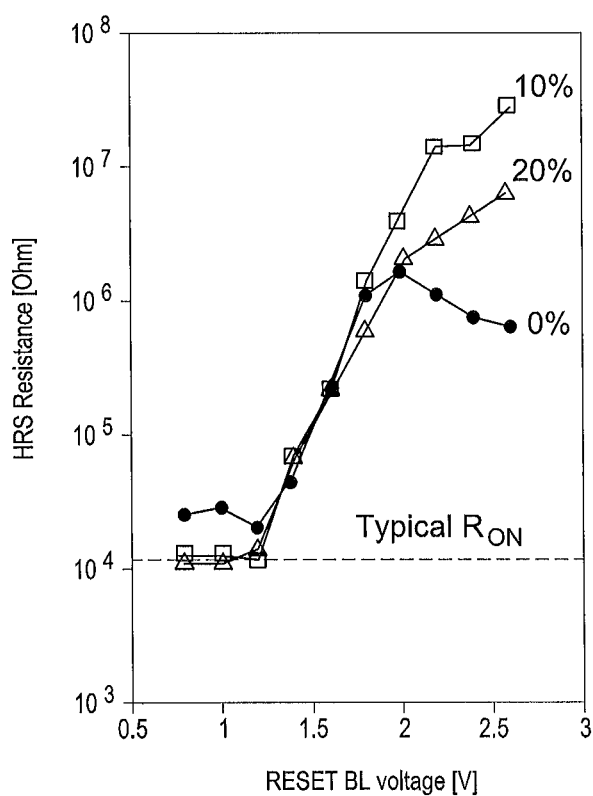
FIG. 2 illustrates the evolution of the "OFF" resistance of a CBRAM memory cell for different atomic percentages of second doping metal within the region of the solid electrolyte.

The effect of the introduction of doping metal in the electrolyte on the memory window is particularly illustrated in FIG. 2 which represents the evolution of the value of the resistance $R_{OFF}$ in the "OFF" state as a function of the erasing voltage (i.e. the RESET voltage). Three curves (i.e. three evolutions of resistance) are represented for three doping levels:
  atomic percentage of 20% of Al in the $Gd_2O_3$ electrolyte;
  atomic percentage of 10% of Al in the $Gd_2O_3$ electrolyte;
  atomic percentage of 0% of Al (i.e. non-doped reference sample) in the $Gd_2O_3$ electrolyte.

FIG. 2 also schematically represents the value of the resistance in the "ON" state; it will be noted that this resistance $R_{ON}$ practically does not vary once the SET voltage threshold is exceeded; the atomic percentage of Al in the electrolyte also has little effect on the value of $R_{ON}$ which remains substantially constant at $10^4$ Ohms. Conversely, it is observed that the value $R_{OFF}$ is much more dependent on the technology used. The more the RESET voltage is increased the more the value of $R_{OFF}$ increases and consequently, the bigger the memory window.

An aspect of the invention is based on the finding that the behaviour of the resistance $R_{OFF}$ as a function of the RESET voltage is not the same according to the atomic percentage of dopant in the electrolyte. Firstly it is observed that the resistance $R_{OFF}$ is higher when the electrolyte is effectively doped by a second metal (i.e. compared to the non-doped reference sample); this phenomenon may be explained by the fact that a doping metal element has been selected in which the associated metal oxide (here $Al_2O_3$) has a bigger window than that of the material of the electrolyte (i.e. $Gd_2O_3$). Beyond this first observation linked to the doping, the applicant has also observed that the atomic doping percentage also has an effect on the value of the memory window. Thus, a doping level of 10% makes it possible to obtain a wider memory window than a doping level of 20%.

Once this particularly beneficial effect observed on the memory window, it is also advisable to ensure that the doping is not going to degrade other electrical characteristics of the memory, particularly the forming voltage and the retention. To do so, the memory according to an embodiment of the invention has an optimised atomic percentage of metal dopant comprised between 5 and 20%, it being understood that a percentage substantially equal to 10% represents a particularly beneficial embodiment (substantial improvement of the memory window without degradation of the forming voltage and the retention).

As regards retention, according to an embodiment, the metal dopant may be selected so that the bond between the dopant D (for illustrative purposes Al) and oxygen (D-O bond) is Smaller than that of Gd—O: such a selection makes it possible to conserve or even improve retention. In the case in point, the Al—O bond has a length of 1.8 A whereas the Gd—O bond has a length of 2.2 A.

The example of $Gd_2O_3$ doped by 10% of Al is not limiting; it will be appreciated that several variants are possible for the pair formed by the electrolyte material and the dopant, among which:

a gadolinium oxide $Gd_2O_3$ doped for example by Si (here the second doping element is not metal but semiconductor), Be, B, Mg, Ca or Sr;
an aluminium oxide $Al_2O_3$ doped by Si;
a hafnium oxide $HfO_2$ doped by Al or Si;
a zirconium oxide $ZrO_2$ doped by Hf, Gd, Al or Si;
a titanium oxide $TiO_2$ doped by Zr, Hf, Gd, Al or Si.

The doped region of the solid electrolyte 12 may for example be made by carrying out a co-sputtering of a target of first metal oxide and a target of second metal. It is particularly possible to measure the atomic percentage of the second doping metal within the doped region of the solid electrolyte 12 by a Rutherford Backscattering Spectroscopy (RBS) technique.

Figure 4:
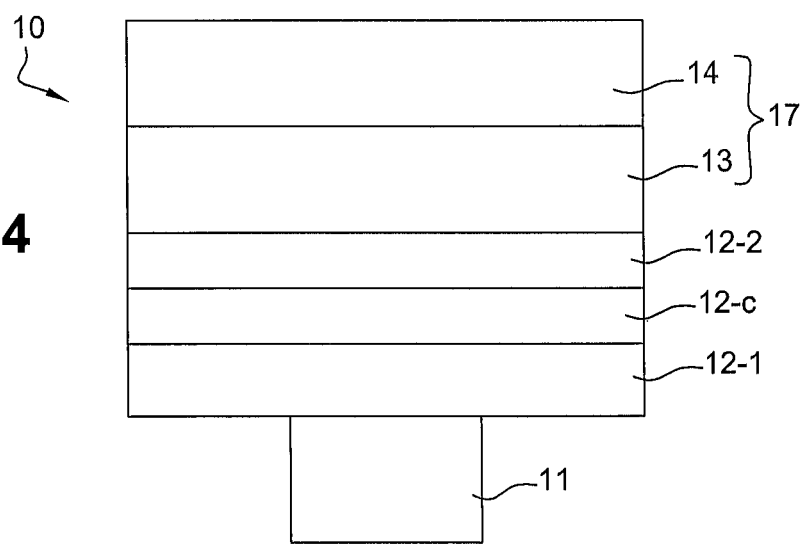

FIG. 4 illustrates a second variant of a memory cell 10 according to an embodiment of the invention in which the doped region of the solid electrolyte 12 is a central sub-layer 12-c of the solid electrolyte 12, the atomic percentage of aluminium Al in the central sub-layer 12-c being substantially equal to 100. The central sub-layer 12-c of the solid electrolyte 12 is comprised between first and second sub-layers 12-1 and 12-2 of the solid electrolyte 12, the first sub-layer 12-1 being in contact with the inert electrode 11, and the second sub-layer 12-2 being in contact with the source of ions layer 13.

The invention claimed is:

1. A Resistive random access memory device comprising:
   a first electrode made of inert material;
   a second electrode made of soluble material, and
   a solid electrolyte, the first and second electrodes being respectively in contact with one of the faces of the solid electrolyte on either side of the solid electrolyte, the second electrode being configured to supply mobile ions circulating in the solid electrolyte to the first electrode to form a conductive filament between the first and second electrodes when a voltage is applied between the first and second electrodes,
   wherein the solid electrolyte comprises a region made of an oxide of a first metal element that forms a first metal oxide, and wherein the region is doped by a second element, distinct from the first metal and able to form a second oxide, the second element being selected such that a band gap energy of the second oxide is strictly greater than the band gap energy of the first metal oxide, an atomic percentage of the second element within the region of the solid electrolyte being comprised between 5% and 20%, and
   wherein the second element is selected such that an electrical permittivity of the material of the doped region is less than or equal to the electrical permittivity of the first metal oxide.

2. The device according to claim 1, wherein the second element is a metal distinct from the first metal and able to form a second metal oxide.

3. The device according to claim 1, wherein the atomic percentage of the second element within the region of the solid electrolyte is substantially equal to 10%.

4. The device according to claim 1, wherein the first metal oxide is gadolinium oxide and wherein the second element is aluminium.

5. The device according to claim 1, wherein the solid electrolyte comprises:
   a first sub-layer in contact with the first electrode made of inert material, and
   a second sub-layer in contact with the second electrode made of soluble material;
   the region of the solid electrolyte made of the first metal oxide doped by the second element being a central sub-layer comprised between the first and second sub-layers.

6. The device according to claim 1, wherein the solid electrolyte comprises:
- a first sub-layer in contact with the first electrode made of inert material;
- a second sub-layer in contact with the second electrode made of soluble material, and
- a central sub-layer comprised between the first and second sub-layers,
- the region of the solid electrolyte made of first metal oxide doped by the second element being the first sub-layer and/or the second sub-layer.

7. The device according to claim 1, wherein the solid electrolyte is entirely formed by the region made of the first metal oxide doped by the second element.

8. A Resistive random access memory device comprising:
- a first electrode made of inert material;
- a second electrode made of soluble material, and
- a solid electrolyte, the first and second electrodes being respectively in contact with one of the faces of the solid electrolyte on either side of the solid electrolyte, the second electrode being configured to supply mobile ions circulating in the solid electrolyte to the first electrode to form a conductive filament between the first and second electrodes when a voltage is applied between the first and second electrodes,
  - wherein the solid electrolyte comprises a region made of an oxide of a first metal element that forms a first metal oxide, and wherein the region is doped by a second element, distinct from the first metal and able to form a second oxide, the second element being selected such that a band gap energy of the second oxide is strictly greater than the band gap energy of the first metal oxide, an atomic percentage of the second element within the region of the solid electrolyte being comprised between 5% and 20%, and
  - wherein the second element is selected such that an electrical permittivity of the second oxide is strictly less than the electrical permittivity of the first metal oxide.

9. A Resistive random access memory device comprising:
- a first electrode made of inert material;
- a second electrode made of soluble material, and
- a solid electrolyte, the first and second electrodes being respectively in contact with one of the faces of the solid electrolyte on either side of the solid electrolyte, the second electrode being configured to supply mobile ions circulating in the solid electrolyte to the first electrode to form a conductive filament between the first and second electrodes when a voltage is applied between the first and second electrodes,
  - wherein the solid electrolyte comprises a region made of an oxide of a first metal element that forms a first metal oxide, and wherein the region is doped by a second element, distinct from the first metal and able to form a second oxide, the second element being selected such that a band gap energy of the second oxide is strictly greater than the band gap energy of the first metal oxide, an atomic percentage of the second element within the region of the solid electrolyte being comprised between 5% and 20%, and
  - wherein the second element is selected such that the first metal oxide doped by the second element has a band gap energy substantially equal to the band gap energy of the first metal oxide not doped by the second element.

10. A Resistive random access memory device comprising:
- a first electrode made of inert material;
- a second electrode made of soluble material, and
- a solid electrolyte, the first and second electrodes being respectively in contact with one of the faces of the solid electrolyte on either side of the solid electrolyte, the second electrode being configured to supply mobile ions circulating in the solid electrolyte to the first electrode to form a conductive filament between the first and second electrodes when a voltage is applied between the first and second electrodes,
  - wherein the solid electrolyte comprises a region made of an oxide of a first metal element that forms a first metal oxide, and wherein the region is doped by a second element, distinct from the first metal and able to form a second oxide, the second element being selected such that a band gap energy of the second oxide is strictly greater than the band gap energy of the first metal oxide, an atomic percentage of the second element within the region of the solid electrolyte being comprised between 5% and 20%, and
  - wherein the second element is selected such that a length of a bond between the second element and oxygen is less than the length of the bond between the first metal element and oxygen.

* * * * *